US011065734B2

(12) United States Patent
Shinozaki

(10) Patent No.: US 11,065,734 B2
(45) Date of Patent: *Jul. 20, 2021

(54) FILM THICKNESS MEASURING DEVICE AND POLISHING DEVICE

(71) Applicant: EBARA CORPORATION, Tokyo (JP)

(72) Inventor: Hiroyuki Shinozaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 811 days.

This patent is subject to a terminal disclaimer.

(21) Appl. No.: 14/644,501

(22) Filed: Mar. 11, 2015

(65) Prior Publication Data

US 2015/0258654 A1 Sep. 17, 2015

(30) Foreign Application Priority Data

Mar. 12, 2014 (JP) .............................. JP2014-048674

(51) Int. Cl.
*B24B 37/013* (2012.01)
*B24B 49/10* (2006.01)
*B24B 37/005* (2012.01)
*B24B 49/00* (2012.01)
(Continued)

(52) U.S. Cl.
CPC .......... *B24B 37/013* (2013.01); *B24B 37/005* (2013.01); *B24B 49/105* (2013.01);
(Continued)

(58) Field of Classification Search
CPC ... B24B 379/013; B24B 49/105; B24B 49/12; B24B 37/105; B24B 37/005;
(Continued)

(56) References Cited

U.S. PATENT DOCUMENTS 5,433,651 A 7/1995 Lustig et al.
5,697,832 A * 12/1997 Greenlaw ............... B24B 37/08
451/290

(Continued)

FOREIGN PATENT DOCUMENTS

JP H07-235520 A 9/1995
JP 2002-529686 A 9/2002
(Continued)

OTHER PUBLICATIONS

Japanese Office Action No. 2014-048674 dated Dec. 19, 2017.
Singapore Office Action issued in Singapore Patent Application No. 10201501848T dated Jul. 17, 2017.

*Primary Examiner* — Karla A Moore
*Assistant Examiner* — Margaret D Klunk
(74) *Attorney, Agent, or Firm* — Pearne & Gordon LLP

(57) ABSTRACT

The present invention improves versatility of a film thickness measuring device. The trigger sensor 220 includes a proximity sensor 222 and a dog 224, and outputs a trigger signal indicating that a polishing table 110 makes one revolution. The eddy current sensor 210 measures a film thickness of a subject to be polished 102 at a timing based on the trigger signal output from the trigger sensor 220. The dog 224 is disposed in an opposite region 250 located at the opposite side of a rotation axis $C_W$ of the top ring 116 with respect to a rotation axis $C_T$ of the polishing table 110. Further, the eddy current sensor 210 and the proximity sensor 222 are disposed at the polishing table 110 so as to be located in the opposite region 250 when the trigger signal is output from the trigger sensor 220.

22 Claims, 8 Drawing Sheets

(51) Int. Cl.
  *H01L 21/67* (2006.01)
  *H01L 21/306* (2006.01)
  *H01L 21/304* (2006.01)
  *H01L 21/66* (2006.01)

(52) U.S. Cl.
  CPC ........ *H01L 21/67092* (2013.01); *B24B 49/00* (2013.01); *H01L 21/304* (2013.01); *H01L 21/30625* (2013.01); *H01L 22/00* (2013.01)

(58) Field of Classification Search
  CPC . B24B 37/013; B24B 49/00; H01L 21/67092; H01L 21/30625; H01L 21/304; H01L 22/00
  See application file for complete search history.

(56) References Cited

U.S. PATENT DOCUMENTS

| | | | |
|---|---|---|---|
| 6,190,234 B1 * | 2/2001 | Swedek | B24B 37/013 257/E21.23 |
| 6,248,000 B1 * | 6/2001 | Aiyer | B24B 37/013 451/41 |
| 6,409,576 B1 | 6/2002 | Oguri et al. | |
| 7,252,575 B2 * | 8/2007 | Kobayashi | B24B 37/013 451/41 |
| 2004/0106357 A1 | 6/2004 | Birang et al. | |
| 2004/0259472 A1 | 12/2004 | Chalmers et al. | |
| 2005/0142996 A1 * | 6/2005 | Ohno | B24B 37/205 451/527 |
| 2006/0166606 A1 * | 7/2006 | Kobayashi | B24B 37/013 451/6 |

FOREIGN PATENT DOCUMENTS

| | | |
|---|---|---|
| JP | 2003-534649 A | 11/2003 |
| JP | 2004-154928 A | 6/2004 |
| JP | 2009-233853 A | 10/2009 |
| WO | 2000/26613 A1 | 5/2000 |
| WO | 01-89765 A1 | 11/2001 |

* cited by examiner

FILM THICKNESS MEASURING DEVICE AND POLISHING DEVICE

CROSS-REFERENCE TO RELATED APPLICATION

This application is based upon and claims the benefit of priority of the prior Japanese Patent Application No. 2014-048674, filed on Mar. 12, 2014, the entire contents of which are incorporated herein by reference.

TECHNICAL FIELD

The present invention relates to a film thickness measuring device and a polishing device.

BACKGROUND ART

In recent years, as semiconductor devices have had higher integration and higher density, wiring of circuits has become further finer and the number of layers of multilayer wiring has increased. In order to realize multilayer wiring while realizing finer circuits, it is necessary to perform planarization processing on surfaces of semiconductor devices with high accuracy.

As a technique for planarizing surfaces of semiconductor devices, CMP (Chemical Mechanical Polishing) is known. A polishing device for performing CMP includes a polishing table to which a polishing pad is pasted, and a top ring for holding a subject to be polished (for example, a substrate such as a semiconductor wafer or various films formed on a surface of the substrate). The polishing device polishes the subject to be polished by pressing the subject to be polished held at the top ring against the polishing pad while rotating the polishing table.

The polishing device includes a film thickness measuring device for detecting an end point of polishing process based on the film thickness of the subject to be polished. The film thickness measuring device includes a film thickness measuring sensor for detecting the film thickness of the subject to be polished. Typical film thickness measuring sensors include an eddy current sensor (R-ECM) and an optical sensor (S-OPM).

The eddy current sensor or the optical sensor is disposed in a hole formed at the polishing table so as to face the subject to be polished through the polishing pad. The eddy current sensor induces an eddy current at the subject to be polished such as a conductive film and detects the thickness of the subject to be polished from change of a magnetic field generated by the eddy current induced at the subject to be polished. On the other hand, the optical sensor irradiates the subject to be polished with light and detects the thickness of the subject to be polished by measuring an interference wave reflected from the subject to be polished.

Because the polishing table on which the film thickness measuring sensor is disposed rotates, during polishing process, a state where the subject to be polished exists above the film thickness measuring sensor and a state where the subject to be polished does not exist above the film thickness measuring sensor, appear alternately.

It is therefore preferable that the film thickness measuring sensor starts measurement before the subject to be polished starts to exist above the film thickness measuring sensor and finishes measurement after the subject to be polished no longer exists above the film thickness measuring sensor. Therefore, in the conventional technique, a trigger sensor for detecting that the polishing table makes one revolution is provided. The trigger sensor is comprised of, for example, a dog disposed outside the polishing table, and a proximity sensor disposed at the polishing table, the proximity sensor detecting the dog every time the polishing table makes one revolution. The polishing device of the conventional technique detects a timing for starting measurement and a timing for finishing measurement of the film thickness measuring sensor based on the output of the trigger sensor.

CITATION LIST

Patent Literature

Patent Literature 1: Japanese Patent Laid-Open No. 2009-233853
Patent Literature 2: National Publication of International Patent Application No. 2002-529686

However, the conventional technique does not take into account improvement of versatility of a film thickness measuring device.

That is, there are some polishing devices in which a polishing table is configured to be able to rotate both in a clockwise direction and in a counterclockwise direction, and a rotation direction of the polishing table is reversed. In such a case, every time the rotation direction of the polishing table changes, it is necessary to change a position where a trigger sensor (a proximity sensor and a dog) is disposed. To change the position where the trigger sensor is disposed, it is necessary to perform rewiring, which may influence existing wiring. If the position where the trigger sensor is disposed cannot be changed due to constraints such as the shape of the trigger sensor, it is necessary to wait for replacement parts, during which the polishing device may not operate.

Meanwhile, in a polishing device having a plurality of polishing tables, there is a case where some polishing tables rotate in a clockwise direction while other polishing tables rotate in a counterclockwise direction. In this case, two types of arrangements for the trigger sensors are mixed in one polishing device, which may complicate the structure.

Therefore, an object of the present invention is to improve versatility of the film thickness measuring device.

SUMMARY OF INVENTION

A film thickness measuring device according to one aspect of the present invention has been made in view of the above-described problems, and is a film thickness measuring device configured to measure a film thickness of a subject to be polished by a polishing device including a polishing table configured to rotate in a clockwise direction and in a counterclockwise direction, and a holding unit configured to rotate while holding the subject to be polished, the film thickness measuring device including a trigger sensor comprising a first member disposed at the polishing table and a second member disposed outside the polishing table, the trigger sensor configured to output a trigger signal indicating that the polishing table makes one revolution based on positional relationship between the first member and the second member, and a film thickness measuring sensor disposed at the polishing table, the film thickness measuring sensor configured to measure the film thickness of the subject to be polished at a timing based on the trigger signal output from the trigger sensor, the second member being disposed in an opposite region located at the opposite side of a rotation axis of the holding unit with respect to a rotation axis of the polishing table, the film thickness measuring sensor and the first member being disposed at the polishing table so as to be located in the opposite region when the trigger signal is output from the trigger sensor.

Further, in the film thickness measuring device according to one aspect, the second member may be disposed on a plane passing through the rotation axis of the holding unit and the rotation axis of the polishing table, in the opposite region, and the film thickness measuring sensor and the first member may be disposed at the polishing table so as to be located on the plane passing through the rotation axis of the holding unit and the rotation axis of the polishing table, in the opposite region when the trigger signal is output from the trigger sensor.

Further, in the film thickness measuring device according to one aspect, the second member may be a dog disposed outside the polishing table, and the first member may be a proximity sensor detecting the dog every time the polishing table makes one revolution.

Further, in the film thickness measuring device according to one aspect, the film thickness measuring device may include a plurality of film thickness measuring sensors, and may further include a timing signal generator configured to output a timing for starting measurement and a timing for finishing measurement for each of the plurality of film thickness measuring sensors based on the trigger signal output from the trigger sensor.

In the film thickness measuring device according to one aspect, one film thickness measuring sensor among the plurality of film thickness measuring sensors may be disposed at the polishing table so as to be located in the opposite region when the trigger signal is output from the trigger sensor, and film thickness measuring sensors other than the one film thickness measuring sensor may be disposed in a region different from a region where the one film thickness measuring sensor is disposed.

Further, in the film thickness measuring device according to one aspect, the timing signal generator may output a timing for starting measurement and a timing for finishing measurement for each of the plurality of film thickness measuring sensors based on the trigger signal, the rotation direction of the polishing table, positional relationship of the plurality of film thickness measuring sensors with respect to the proximity sensor, and rotation speed of the polishing table.

Further, the film thickness measuring device according to one aspect of the present invention includes a film thickness measuring device according to any of the above, a polishing table to which a polishing pad for polishing the subject to be polished is pasted, a first driving unit configured to rotate the polishing table in a clockwise direction and in a counterclockwise direction, a holding unit configured to hold the subject to be polished and pressing the subject to be polished against the polishing pad, and a second driving unit configured to rotate the holding unit.

According to the present invention, it is possible to improve versatility of the film thickness measuring device.

DESCRIPTION OF EMBODIMENTS

A polishing device according to one embodiment of the present invention will be described below based on the drawings.

First Embodiment

Polishing Device

Figure 1:
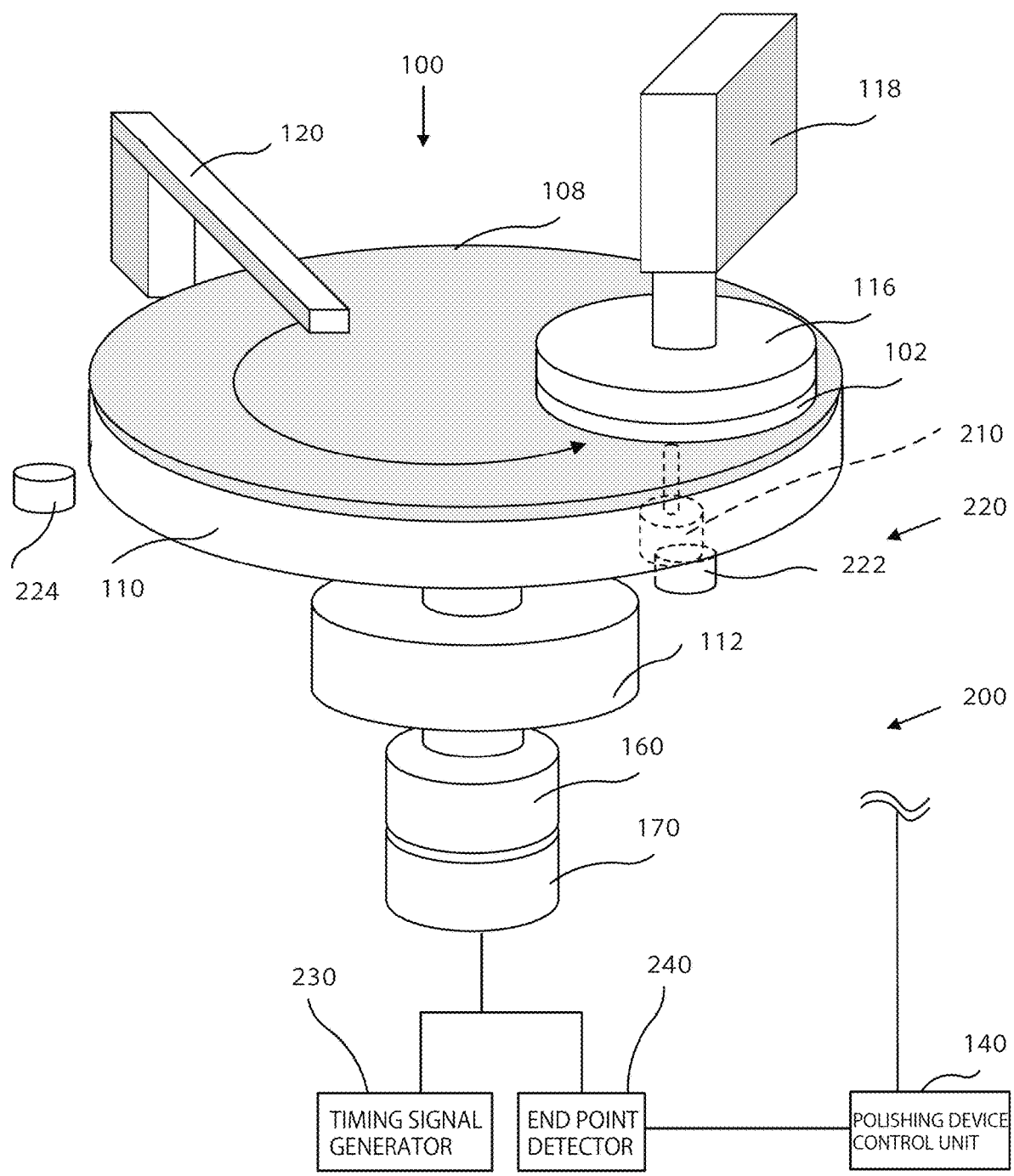
FIG. 1 is a diagram schematically illustrating an overall structure of a polishing device according to a first embodiment.

FIG. 1 is a diagram schematically illustrating an overall structure of a polishing device according to the first embodiment. As illustrated in FIG. 1, the polishing device 100 includes a polishing table 110 on which a polishing pad 108 for polishing a subject to be polished (for example, a substrate such as a semiconductor wafer or various films formed on a surface of the substrate) 102 can be placed on a top face. Further, the polishing device 100 includes a first electric motor 112 rotationally driving the polishing table 110 in a clockwise direction and in a counterclockwise direction. Still further, the polishing device 100 includes a top ring (holding unit) 116 capable of holding the subject to be polished 102. Further, the polishing device 100 includes a second electric motor 118 rotationally driving the top ring 116.

Further, the polishing device 100 includes a slurry line 120 supplying polishing liquid including a polishing agent to the top face of the polishing pad 108. Still further, the polishing device 100 includes a polishing device control unit 140 outputting various control signals regarding the polishing device 100.

When polishing the subject to be polished 102, the polishing device 100 supplies polishing slurry including polishing abrasive grains from the slurry line 120 to the top face of the polishing pad 108 and rotationally drives the polishing table 110 by the first electric motor 112. The polishing device 100 then presses the subject to be polished 102 held by the top ring 116 against the polishing pad 108 while rotating the top ring 116 around a rotation axis which is eccentric from a rotation axis of the polishing table 110. By this means, the subject to be polished 102 is polished by the polishing pad 108 holding the polishing slurry and becomes flat.

<Film Thickness Measuring Device>

A film thickness measuring device 200 will be described next. As illustrated in FIG. 1, the film thickness measuring device 200 includes an eddy current sensor 210 and a trigger sensor 220. Further, the film thickness measuring device 200 includes a timing signal generator 230 connected to the eddy current sensor 210 and the trigger sensor 220 via rotary joint connectors 160 and 170. Further, the film thickness measuring device 200 includes an end point detector 240 connected to the eddy current sensor 210 via the rotary joint connectors 160 and 170. The trigger sensor 220 includes a proximity sensor 222 (first member) disposed at the polishing table 110 and a dog 224 (second member) disposed outside the polishing table 110.

At the polishing table 110, a hole into which the eddy current sensor 210 can be inserted from a reverse side of the polishing table 110 is formed. The eddy current sensor 210 is inserted into the hole formed at the polishing table 110. It should be noted that the polishing table 110 is connected to the ground.

The eddy current sensor 210 includes an exciting coil, a detection coil and a balance coil. The exciting coil is excited by an AC current supplied from an AC source and forms an eddy current at the subject to be polished 102 disposed near the exciting coil. A magnetic flux generated by the eddy current formed at the subject to be polished 102 interlinks with the detection coil and the balance coil. Because the detection coil is disposed at a position closer to a conductive film, balance of induced voltages generated at the both coils is lost. By this means, the eddy current sensor 210 detects an interlinkage magnetic flux formed by the eddy current of the subject to be polished and detects a thickness of the subject to be polished based on the detected interlinkage magnetic flux. It should be noted that while an example has been described here where the eddy current sensor 210 is disposed, the present invention is not limited to this, and it is also possible to dispose an optical sensor which illuminates the subject to be polished with light and detects the thickness of the subject to be polished by measuring an interference wave reflected from the subject to be polished.

The proximity sensor 222 is pasted to a lower face (face to which the polishing pad 108 is not pasted) of the polishing table 110. The dog 224 is disposed outside the polishing table 110 so as to be detected by the proximity sensor 222. The trigger sensor 220 outputs a trigger signal indicating that the polishing table 110 makes one revolution based on the positional relationship between the proximity sensor 222 and the dog 224. Specifically, the trigger sensor 220 outputs a trigger signal when the proximity sensor 222 approaches closest to the dog 224.

The timing signal generator 230 outputs to the eddy current sensor 210 a timing for starting measurement and a timing for finishing measurement for the eddy current sensor 210 based on the trigger signal output from the trigger sensor 220. For example, the timing signal generator 230 outputs to the eddy current sensor 210 a timing at which a predetermined time period has elapsed since the trigger signal was output from the trigger sensor 220 as the timing for starting measurement. Further, the timing signal generator 230 outputs to the eddy current sensor 210 a timing at which a predetermined time period has elapsed since the trigger signal was output from the trigger sensor 220 as the timing for finishing measurement. Here, the predetermined time period is stored in the timing signal generator 230 in advance as a parameter.

The end point detector 240 monitors change of the film thickness of the subject to be polished 102 based on the signal output from the eddy current sensor 210. The end point detector 240 is connected to the polishing device control unit 140 that performs various control regarding the polishing device 100. When detecting an end point of polishing of the subject to be polished 102, the end point detector 240 outputs a signal indicating the detection to the polishing device control unit 140. The polishing device control unit 140 finishes polishing performed by the polishing device 100 when receiving the signal indicating the end point of polishing from the end point detector 240.

Figure 2:
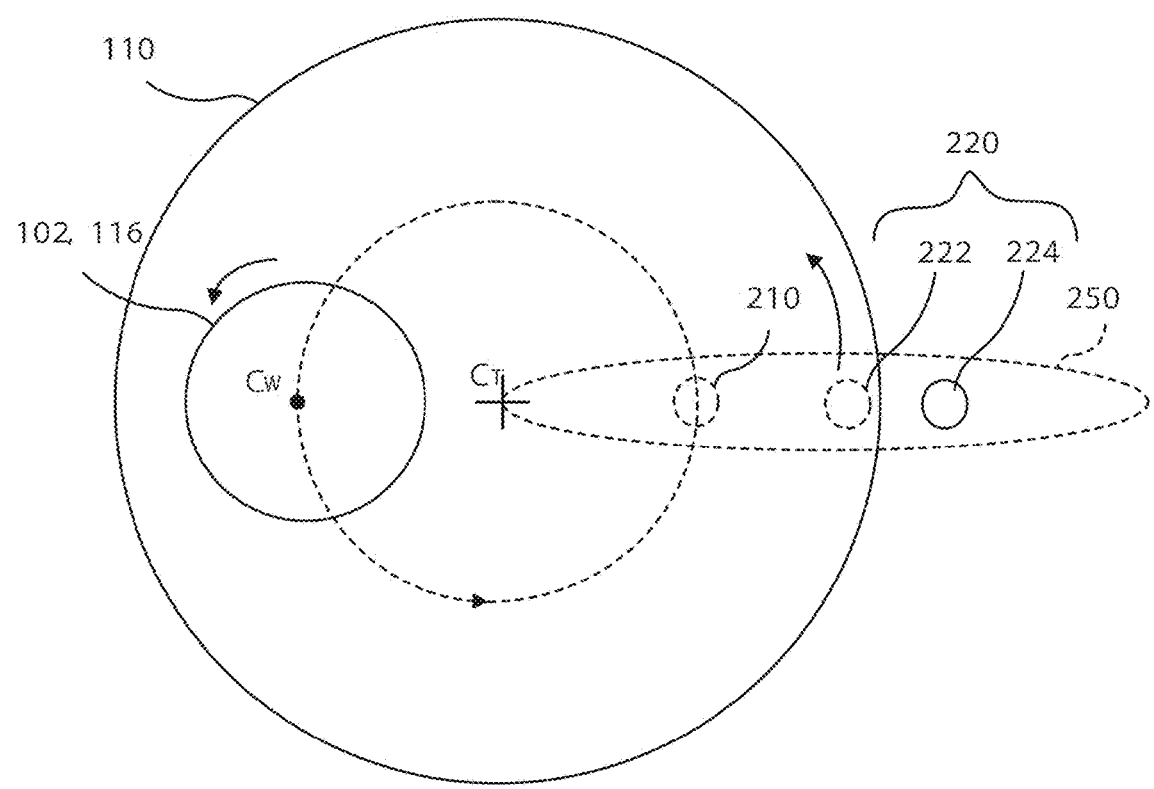
FIG. 2 is a plan view illustrating positional relationship among a top ring, an eddy current sensor and a trigger sensor.
Figure 3:
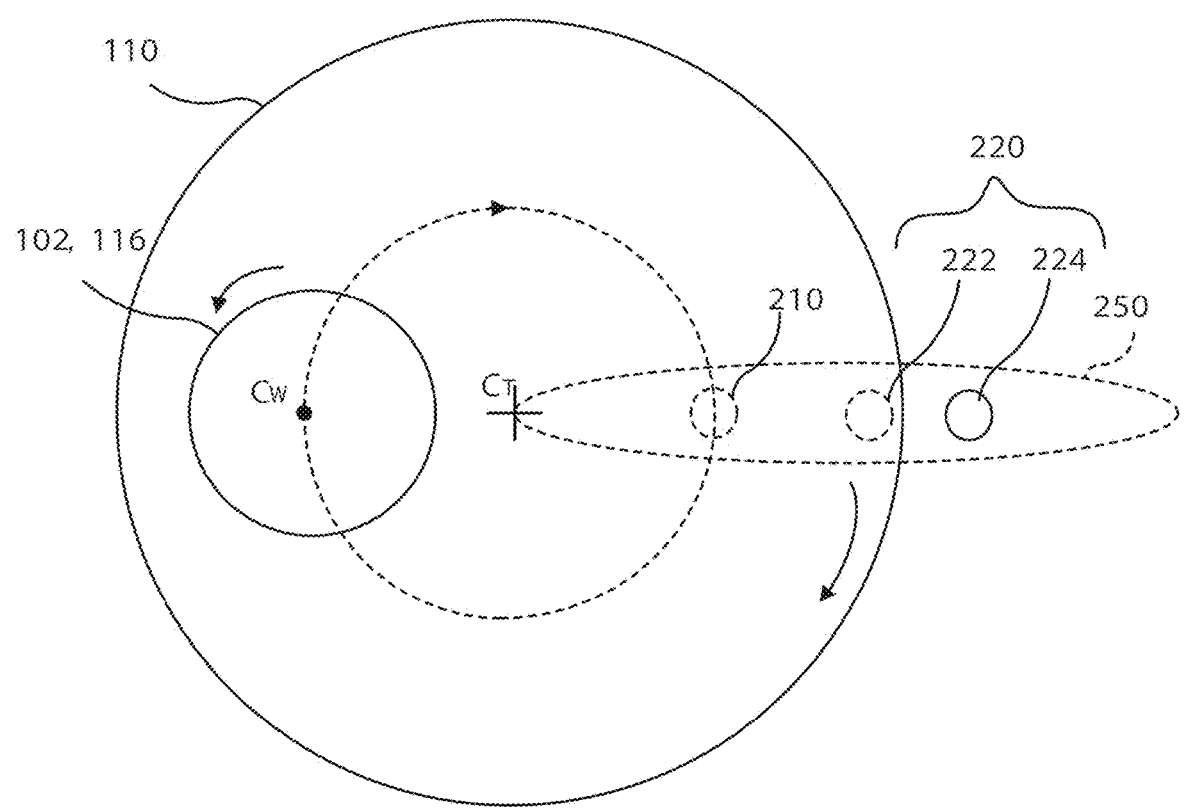
FIG. 3 is a plan view illustrating positional relationship among the top ring, the eddy current sensor and the trigger sensor.

FIG. 2 and FIG. 3 are plan views illustrating positional relationship among the top ring 116, the eddy current sensor 210 and the trigger sensor 220. FIG. 2 illustrates a case where the polishing table 110 rotates in a clockwise direction, while FIG. 3 illustrates a case where the polishing table 110 rotates in a counterclockwise direction. As illustrated in FIG. 2 and FIG. 3, the eddy current sensor 210 is provided at a position passing through a rotation axis $C_W$ of the top ring 116 (center (rotation axis) of the subject to be polished 102 which is held by the top ring 116 and which is being polished). A reference sign $C_T$ indicates a rotation axis of the polishing table 110.

The eddy current sensor 210 is configured to be able to continuously detect the thickness of the subject to be polished 102 on a trajectory (scanning line) while the eddy current sensor 210 passes below the subject to be polished 102 which is held by the top ring 116 and which is being polished. For example, the eddy current sensor 210 measures the film thickness of the subject to be polished 102 at a timing based on the trigger signal detected by the trigger sensor 220. Specifically, the eddy current sensor 210 starts measurement of the eddy current sensor 210 at the timing for starting measurement based on the trigger signal (for example, immediately before the subject to be polished 102 starts to exist above the eddy current sensor 210). Further, the eddy current sensor 210 finishes measurement of the eddy current sensor 210 at the timing for finishing measurement based on the trigger signal (for example, immediately after the subject to be polished 102 no longer exists above the eddy current sensor 210).

The dog 224 is disposed in an opposite region 250 located at the opposite side of the rotation axis $C_W$ of the top ring 116 with respect to the rotation axis $C_T$ of the polishing table 110. That is, the opposite region 250 is located at the opposite side from the rotation axis $C_W$ of the top ring 116 across the rotation axis $C_T$ of the polishing table 110. In other words, the opposite region 250 is located at the opposite side of the rotation axis $C_W$ of the top ring 116 across the rotation axis $C_T$ of the polishing table 110. Further, the eddy current sensor 210 and the proximity sensor 222 are disposed at the polishing table 110 so as to be located in the opposite region 250 when the trigger signal is output from the trigger sensor 220. It should be noted that the opposite region 250 is a region including a position obtained by rotating the rotation axis $C_W$ of the top ring 116 around the rotation axis $C_T$ of the polishing table 110 by approximately 180 degrees, and located in a radial fashion from the rotation axis $C_T$ of the polishing table 110. The opposite region 250 is preferably a region including a position obtained by rotating the rotation axis $C_W$ of the top ring 116 around the rotation axis $C_T$ of the polishing table 110 by 180 degrees±30%, and located in a radial fashion from the rotation axis $C_T$ of the polishing table 110. Further, the opposite region 250 is more preferably a region including a position obtained by rotating the rotation axis $C_W$ of the top ring 116 around the rotation axis $C_T$ of the polishing table 110 by 180 degrees±20% and located in a radial fashion from the rotation axis $C_T$ of the polishing table 110. Still further, the opposite region 250 is still more preferable a region including a position obtained by rotating the rotation axis $C_W$ of the top ring 116 around the rotation axis $C_T$ of the polishing table 110 by 180 degrees±10% and located in a radial fashion from the rotation axis $C_T$ of the polishing table 110.

That is, the state of FIG. 2 indicates a state where the trigger signal is output from the trigger sensor 220 while the proximity sensor 222 approaches closest to the dog 224. In this state, both the eddy current sensor 210 and the proximity sensor 222 are located in the opposite region 250.

It should be noted that the dog 224 is preferably disposed on a plane passing through the rotation axis $C_W$ of the top ring 116 and the rotation axis $C_T$ of the polishing table 110, in the opposite region 250. However, the position of the dog 224 is not limited to this, and it is only necessary to dispose the dog 224 within the opposite region 250. Further, the eddy current sensor 210 and the proximity sensor 222 are preferably disposed at the polishing table 110 so as to be located on a plane passing through the rotation axis $C_W$ of the top ring 116 and the rotation axis $C_T$ of the polishing table 110, in the opposite region 250 when the trigger signal is output from the trigger sensor 220. However, the positions of the eddy current sensor 210 and the proximity sensor 222 are not limited to this, and it is only necessary to dispose the eddy current sensor 210 and the proximity sensor 222 at the polishing table 110 so as to be located in the opposite region 250 when the trigger signal is output from the trigger sensor 220.

According to the present embodiment, it is possible to improve versatility of the film thickness measuring device 200. That is, considering a case where the polishing table 110 can rotate in a clockwise direction and in a counterclockwise direction and the rotation direction of the polishing table 110 is reversed as in the present embodiment, in the conventional technique, a time period from when the trigger signal is output until the timing for starting measurement and the timing for finishing measurement differs depending on the rotation direction of the polishing table 110. Therefore, in the conventional technique, every time the rotation direction of the polishing table 110 changes, it may be necessary to change the position where the trigger sensor 220 (the proximity sensor 222 and the dog 224) is disposed. To change the position where the trigger sensor 220 is disposed, it is necessary to perform rewiring, which may influence existing wiring. If the position where the trigger sensor 220 is disposed cannot be changed due to constraints such as the shape of the trigger sensor 220, it is necessary to wait for replacement parts, during which the polishing device 100 may not operate.

On the other hand, according to the present embodiment, regardless of the rotation direction of the polishing table 110, the timing for starting measurement comes when a predetermined time period (α) has elapsed since the trigger signal was output, and the timing for finishing measurement comes when another predetermined time period (β) has elapsed since the trigger signal is output. In other words, the predetermined time period (α) and another predetermined time period (β) do not depend on the rotation direction of the polishing table 110 and are fixed. Therefore, according to the present embodiment, even if the rotation direction of the polishing table is reversed, it is not necessary to change the position where the trigger sensor 220 is disposed. As a result, it is possible to improve versatility of the film thickness measuring device 200.

Second Embodiment

The second embodiment will be described next. The second embodiment differs from the first embodiment in that a plurality of film thickness measuring sensors for measuring the film thickness of the subject to be polished 102 are disposed. Description of the same structure as that of the first embodiment will be omitted.

Figure 4:
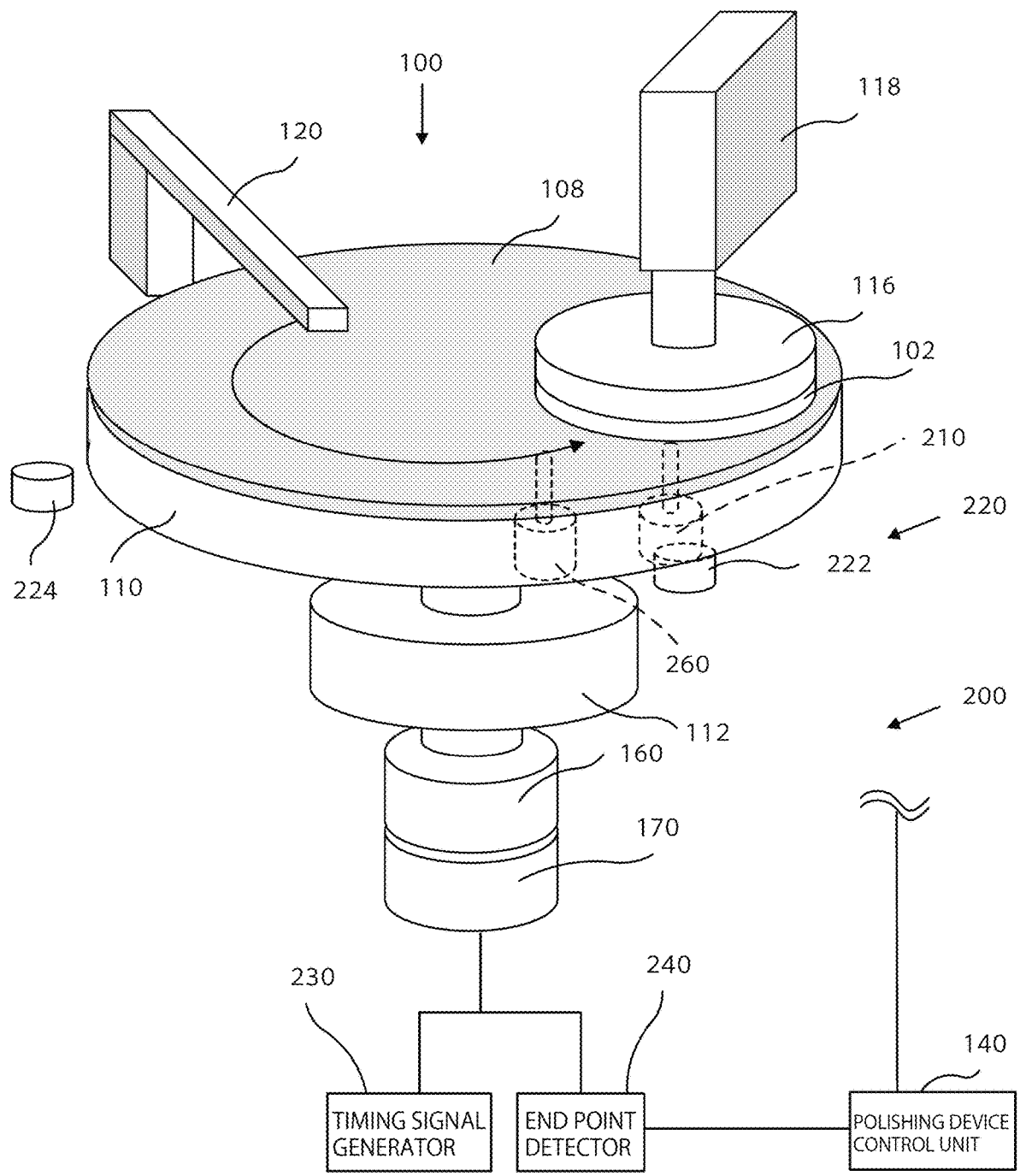
FIG. 4 is a diagram schematically illustrating an overall structure of a polishing device according to a second embodiment.

FIG. 4 is a diagram schematically illustrating an overall structure of the polishing device according to the second embodiment. As illustrated in FIG. 4, in the second embodiment, the film thickness measuring device 200 includes a plurality of (two types of) film thickness sensors, that is, the eddy current sensor 210 and the optical sensor 260.

Figure 5:
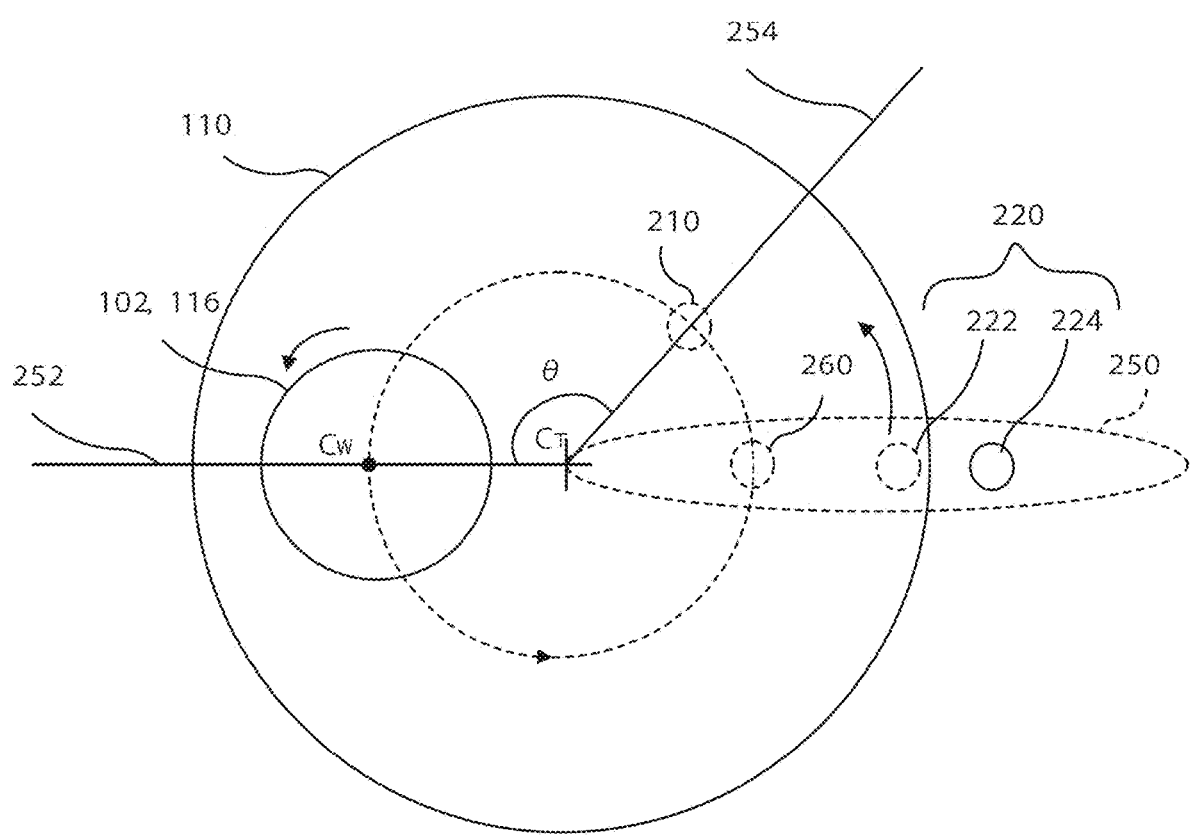
FIG. 5 is a plan view illustrating positional relationship among the top ring, the eddy current sensor, an optical sensor, and the trigger sensor.
Figure 6:
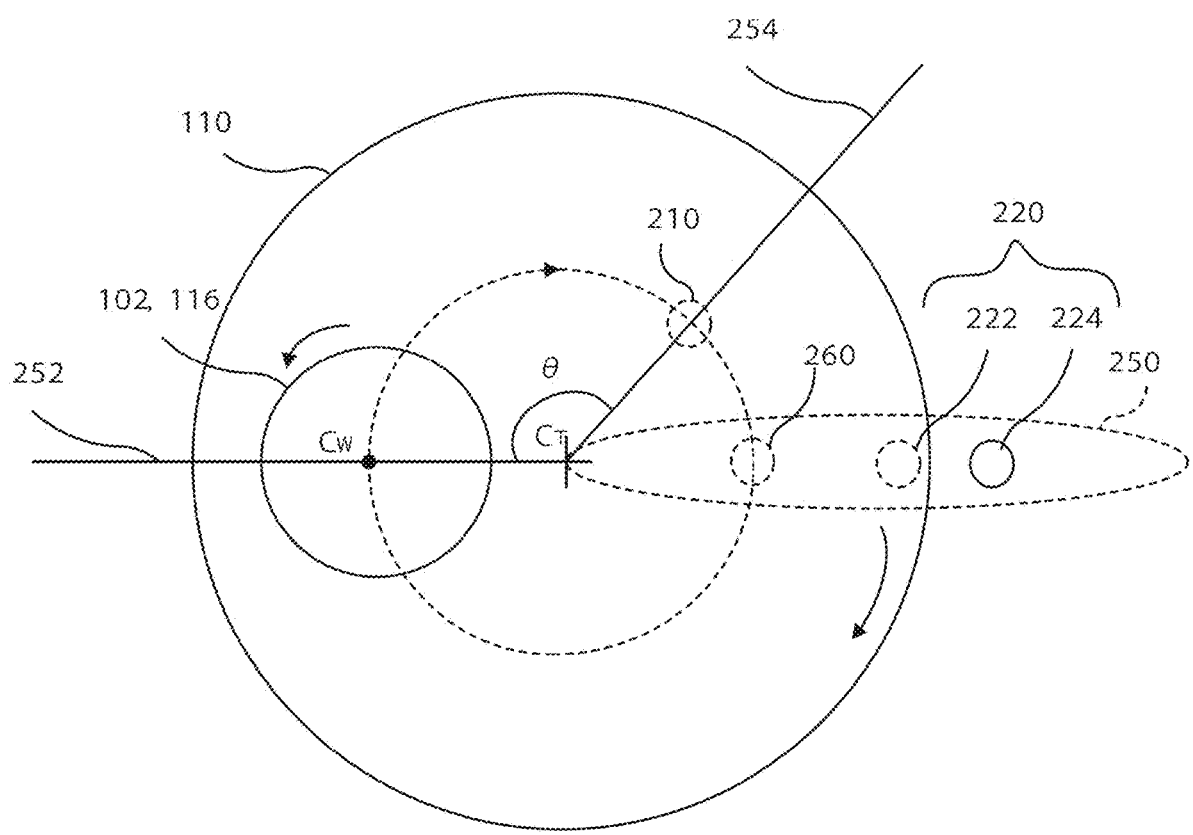
FIG. 6 is a plan view illustrating positional relationship among the top ring, the eddy current sensor, the optical sensor and the trigger sensor.

FIG. 5 and FIG. 6 are plan views illustrating positional relationship among the top ring 116, the eddy current sensor 210, the optical sensor 260 and the trigger sensor 220. FIG. 5 illustrates a case where the polishing table 110 rotates in a counterclockwise direction, while FIG. 6 illustrates a case where the polishing table 110 rotates in a clockwise direction.

As illustrated in FIG. 5 and FIG. 6, both the eddy current sensor 210 and the optical sensor 260 are provided at positions passing through the rotation axis $C_W$ of the top ring 116. As illustrated in FIG. 5 and FIG. 6, one film thickness sensor (optical sensor 260) among the plurality of film thickness measuring sensors is disposed at the polishing table 110 so as to be located in the opposite region 250 when the trigger signal is output from the trigger sensor 220.

Meanwhile, a film thickness measuring sensor (eddy current sensor 210) other than the optical sensor 260 is disposed in a region different from the region where the optical sensor 260 is disposed. For example, when an angle formed by a line 252 connecting the rotation axis $C_W$ of the top ring 116 and the rotation axis $C_T$ of the polishing table 110 and a line 254 connecting the rotation axis $C_T$ of the polishing table 110 and the center of the eddy current sensor 210 is defined as θ, the eddy current sensor 210 is preferably disposed so that θ=100 to 140 degrees, but the position of the eddy current sensor 210 is not limited to this.

It should be noted that while an example has been described where the optical sensor 260 is disposed at the polishing table 110 so as to be located in the opposite region 250 when the trigger signal is output from the trigger sensor 220, the position of the optical sensor 260 is not limited to this example. For example, both the eddy current sensor 210 and the optical sensor 260 may be disposed at the polishing table 110 so as not to be located in the opposite region 250 when the trigger signal is output from the trigger sensor 220.

The timing signal generator 230 outputs to the eddy current sensor 210 and the optical sensor 260 timings for starting measurement and timings for finishing measurement for the eddy current sensor 210 and the optical sensor 260 based on the trigger signal output from the trigger sensor 220.

That is, in the polishing device 100, there is a case where the rotation direction of the polishing table 110 changes between the clockwise direction and the counterclockwise direction as described in the first embodiment. Further, there is a case where the polishing device 100 includes a polishing table rotating in a clockwise direction and a polishing table rotating in a counterclockwise direction.

In such a case, as described in the first embodiment, concerning the optical sensor 260, a predetermined period (α) from when the trigger signal is output until the timing for starting measurement and a predetermined time period (β) from when the trigger signal is output until the timing for finishing measurement are fixed regardless of the rotation direction of the polishing table 110.

On the other hand, as illustrated in FIG. 5 and FIG. 6, concerning the eddy current sensor 210, a predetermined time period from when the trigger signal is output until the timing for starting measurement and a predetermined time period from when the trigger signal is output until the timing for finishing measurement change according to the rotation direction of the polishing table 110.

Therefore, the timing signal generator 230 outputs the timings for starting measurement and the timings for finishing measurement for the eddy current sensor 210 and the optical sensor 260 based on the trigger signal, the rotation direction of the polishing table 110, the positional relationship of the eddy current sensor 210 and the optical sensor 260 with respect to the proximity sensor 222, and the rotation speed of the polishing table 110.

The timing signal generator 230 can store in advance the positional relationship of the eddy current sensor 210 and the optical sensor 260 with respect to the proximity sensor 222 as an angle parameter. The timing signal generator 230 calculates the timings for starting measurement and the timings for finishing measurement for the eddy current sensor 210 and the optical sensor 260 taking into account the rotation direction of the polishing table 110, the rotation speed of the polishing table 110 and the angle parameter of the eddy current sensor 210 and the optical sensor 260. The timing signal generator 230 outputs the calculated timings for starting measurement and timings for finishing measurement to the eddy current sensor 210 and the optical sensor 260.

According to the present embodiment, an appropriate timing for starting measurement and an appropriate timing for finishing measurement are output to each of the plurality of film thickness measuring sensors. Therefore, even when a plurality of film thickness measuring sensors are disposed and the rotation direction of the polishing table 110 is reversed, or polishing tables 110 with different rotation directions are mixed, it is not necessary to change the position where the trigger sensor 220 is disposed. As a result, according to the present embodiment, it is possible to improve versatility of the film thickness measuring device 200.

Further, when there are a plurality of film thickness measuring sensors, in the conventional technique, there is a problem that because there is a case where the trigger sensor 220 is provided for each of the film thickness measuring sensors, the arrangement of the trigger sensor 220 becomes complicated. By contrast to this, in the present embodiment, because it is only necessary to provide one trigger sensor 220, it is possible to simplify the structure of the film thickness measuring device.

Figure 7:
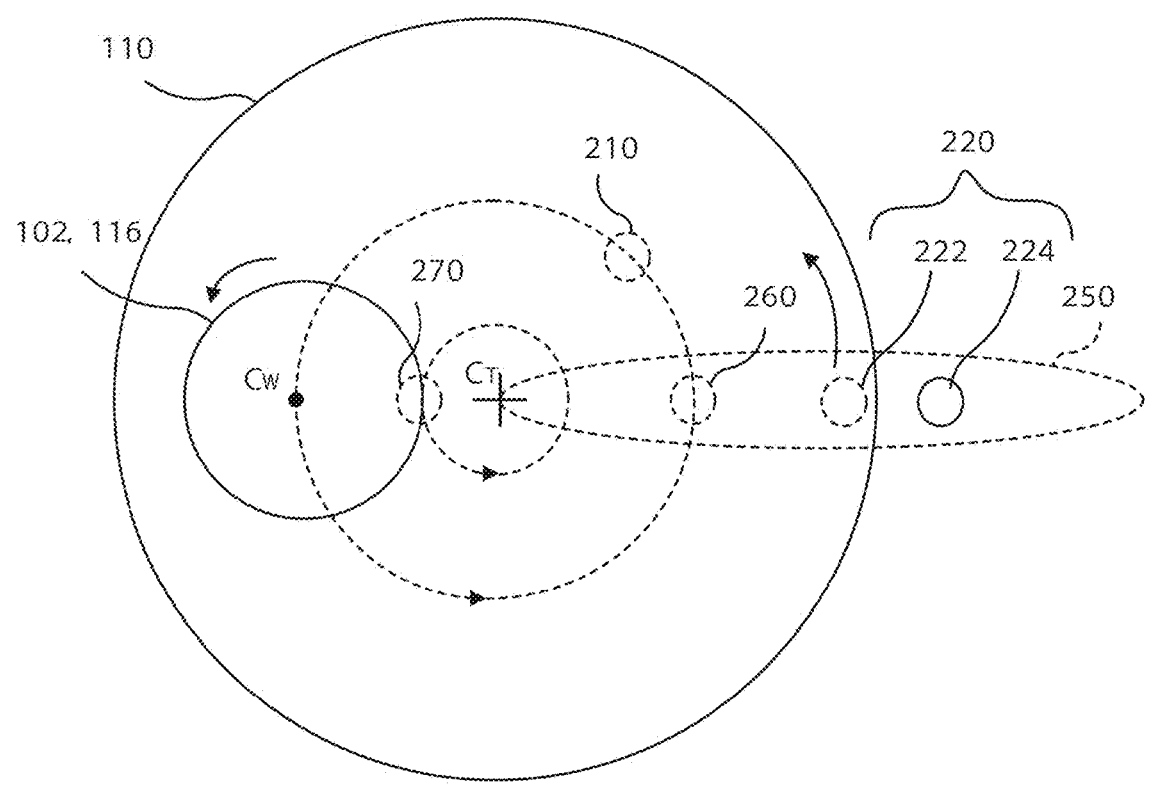
FIG. 7 is a plan view illustrating positional relationship among the top ring, the eddy current sensor, two optical sensors and the trigger sensor.
Figure 8:
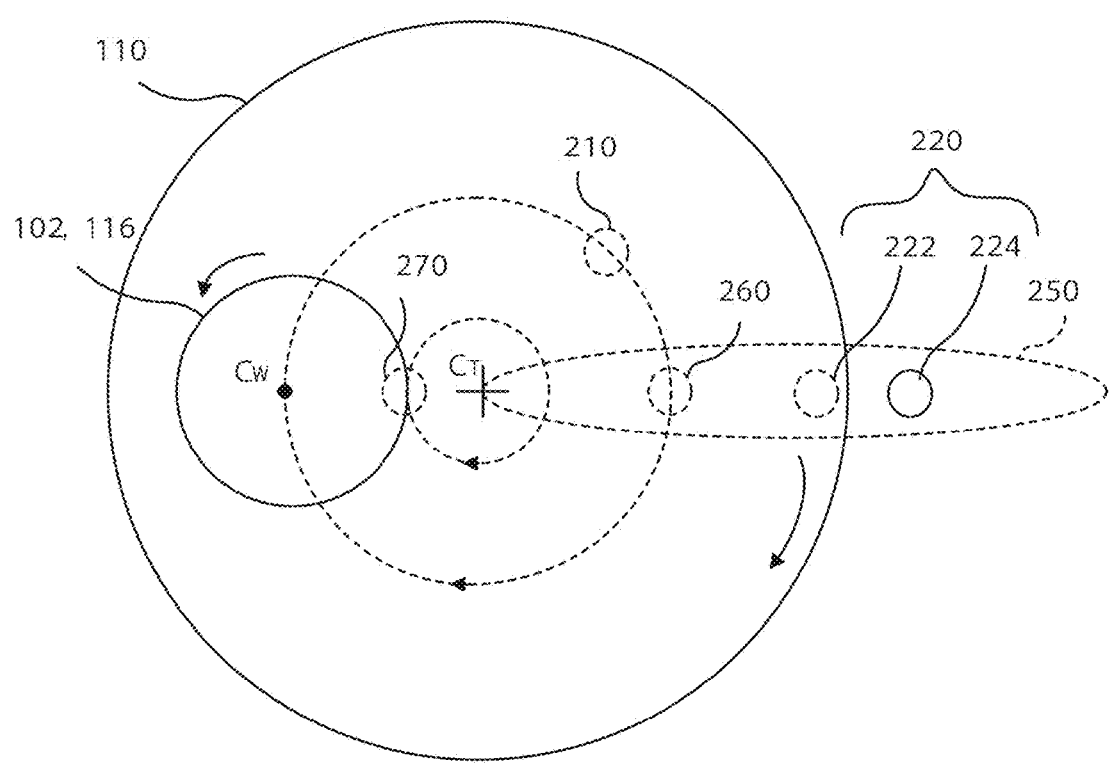
FIG. 8 is a plan view illustrating positional relationship among the top ring, the eddy current sensor, the two optical sensors and the trigger sensor.

It should be noted that the arrangement of the plurality of film thickness measuring sensors is not limited to the case as illustrated in FIG. 5 and FIG. 6. FIG. 7 and FIG. 8 are plan views illustrating positional relationship among the top ring 116, the eddy current sensor 210, two optical sensors 260 and 270 and the trigger sensor 220.

As illustrated in FIG. 7 and FIG. 8, the plurality of film thickness measuring sensors do not have to be provided at positions passing through the rotation axis $C_W$ of the top ring 116. In the examples of FIG. 7 and FIG. 8, the optical sensor 270 is disposed at the polishing table 110 so as to be able to measure a film thickness of an edge of the subject to be polished 102.

In this case, the timing signal generator 230 can output an appropriate timing for starting measurement and an appropriate timing for finishing measurement to each of the eddy current sensor 210, the optical sensor 260 and the optical sensor 270 using the same method as described above.

As described above, according to the present embodiment, it is not necessary to provide a plurality of trigger sensors 220 unlike the conventional device. Therefore, according to the present embodiment, it is possible to solve problems that the structure becomes complicated due to a plurality of trigger sensors 220 being mixed in one polishing device, that it is necessary to perform complicated rewiring, that there is a possibility of causing faulty wiring, and that it is necessary to wait for replacement parts of the trigger sensor 220, so that it is possible to provide a film thickness measuring device having flexibility and reliability and a polishing device.

REFERENCE SIGNS LIST

100 Polishing device
102 Subject to be polished
108 Polishing pad
110 Polishing table
112 First electric motor (first driving unit)
116 Top ring (holding unit)
118 Second electric motor (second driving unit)
200 Film thickness measuring device
210 Eddy current sensor
220 Trigger sensor
222 Proximity sensor
224 Dog
230 Timing signal generator
240 End point detector
250 Opposite region
260, 270 Optical sensor
$C_T$ Rotation axis of polishing table 110
$C_W$ Rotation axis of top ring 116

What is claimed is:

1. A polishing device comprising:
    a polishing table configured to rotate in a clockwise direction and in a counterclockwise direction;
    a holding unit configured to rotate while holding a subject to be polished;
    a trigger sensor comprising a first member disposed at the polishing table and a second member disposed outside the polishing table, the trigger sensor being configured to output a trigger signal indicating that the polishing table makes one revolution based on a positional relationship between the first member and the second member; and
    a first film thickness measuring sensor disposed at the polishing table, the first film thickness measuring sensor configured to measure the film thickness of the subject to be polished at a timing based on the trigger signal output from the trigger sensor,
    wherein the second member of the trigger sensor is disposed outside the polishing table in an opposite region that is 180 degrees ±30% (54 degrees) about a rotation axis of the polishing table from a rotation axis of the holding unit, and
    wherein the first film thickness measuring sensor and the first member of the trigger sensor are disposed at the polishing table so that when the trigger signal is output from the trigger sensor, the first film thickness measuring sensor and first member are located in the opposite region and the first film thickness measuring sensor is not located under the holding unit.

2. The polishing device according to claim 1, wherein:
the second member of the trigger sensor is disposed on a plane extending parallel to and passing through the rotation axis of the holding unit and the rotation axis of the polishing table, and
the first film thickness measuring sensor and the first member are disposed at the polishing table so as to be located on the plane when the trigger signal is output from the trigger sensor.

3. The polishing device according to claim 2, wherein:
the second member is a dog disposed outside the polishing table, and
the first member is a proximity sensor detecting the dog every time the polishing table makes one revolution.

4. The polishing device according to claim 2, wherein the polishing device comprises:
a second film thickness measuring sensor disposed at the polishing table, the second film thickness measuring sensor configured to measure the film thickness of the subject to be polished at a timing based on the trigger signal output from the trigger sensor; and
a timing signal generator configured to output a timing for starting measurement and a timing for finishing measurement for each of the first and second film thickness measuring sensors based on the trigger signal output from the trigger sensor.

5. The polishing device according to claim 1, wherein:
the second member is a dog disposed outside the polishing table, and
the first member is a proximity sensor detecting the dog every time the polishing table makes one revolution.

6. The polishing device according to claim 5, wherein the polishing device comprises:
a second film thickness measuring sensor disposed at the polishing table, the second film thickness measuring sensor configured to measure the film thickness of the subject to be polished at a timing based on the trigger signal output from the trigger sensor; and
a timing signal generator configured to output a timing for starting measurement and a timing for finishing measurement for each of the first and second film thickness measuring sensors based on the trigger signal output from the trigger sensor.

7. The polishing device according to claim 1, wherein the polishing device comprises:
a second film thickness measuring sensor disposed at the polishing table, the second film thickness measuring sensor configured to measure the film thickness of the subject to be polished at a timing based on the trigger signal output from the trigger sensor; and
a timing signal generator configured to output a timing for starting measurement and a timing for finishing measurement for each of the first and second film thickness measuring sensors based on the trigger signal output from the trigger sensor.

8. The polishing device according to claim 7, wherein when the trigger signal is output from the trigger sensor:
the first film thickness measuring sensor is disposed in the opposite region, and
the second film thickness measuring sensor is disposed in a region different from the opposite region.

9. The polishing device according to claim 8, wherein the timing signal generator outputs the timing for starting measurement and the timing for finishing measurement for each of the first and second film thickness measuring sensors based on the trigger signal, the rotation direction of the polishing table, the positional relationship of the first and second film thickness measuring sensors with respect to the proximity sensor, and the rotation speed of the polishing table.

10. The polishing device according to claim 7, wherein the timing signal generator outputs the timing for starting measurement and the timing for finishing measurement for each of the first and second film thickness measuring sensors based on the trigger signal, the rotation direction of the polishing table, the positional relationship of the first and second film thickness measuring sensors with respect to the proximity sensor, and the rotation speed of the polishing table.

11. The polishing device according to claim 1, further comprising:
a first driving unit configured to rotate the polishing table in the clockwise direction and in the counterclockwise direction; and
a second driving unit configured to rotate the holding unit.

12. The polishing device according to claim 1, wherein the opposite region is 180 degrees ±20% (36 degrees) about the rotation axis of the polishing table from the rotation axis of the holding unit.

13. The polishing device according to claim 1, wherein the opposite region is 180 degrees ±10% (18 degrees) about the rotation axis of the polishing table from the rotation axis of the holding unit.

14. The polishing device according to claim 1, wherein the second member of the trigger sensor is disposed on a plane extending parallel to and passing through the rotation axis of the holding unit and the rotation axis of the polishing table.

15. The polishing device according to claim 1, further comprising a timing signal generator storing a predetermined time that is fixed and does not depend on the rotation direction of the polishing table, wherein the first film thickness measuring sensor starts measuring when the predetermined time has elapsed since the trigger sensor outputs the trigger signal.

16. The polishing device according to claim 15, wherein the first film thickness measuring sensor starts measuring before the subject to be polished becomes located above the first film thickness measuring sensor.

17. A polishing device comprising:
a polishing table configured to rotate in a clockwise direction and in a counterclockwise direction;
a holding unit configured to rotate while holding a subject to be polished;
a trigger sensor comprising a first member disposed at the polishing table and a second member disposed outside the polishing table, the trigger sensor being configured to output a trigger signal indicating that the polishing table makes one revolution based on a positional relationship between the first member and the second member; and
a film thickness measuring sensor disposed at the polishing table, the film thickness measuring sensor configured to measure the film thickness of the subject to be polished at a timing based on the trigger signal output from the trigger sensor,
wherein a rotation axis of the polishing table is disposed between the second member and the holding unit, and
wherein when the trigger signal is output from the trigger sensor, the film thickness measuring sensor is not located under the holding unit.

18. The polishing device according to claim 17, wherein when the trigger signal is output from the trigger sensor:

the rotation axis is located between the film thickness measuring sensor and the holding unit, and the rotation axis is located between the first member and the holding unit.

19. A polishing device comprising:
a polishing table configured to rotate in a clockwise direction and in a counterclockwise direction;
a holding unit configured to rotate while holding a subject to be polished;
a timing signal generator storing a predetermined time that is fixed and does not depend on the rotation direction of the polishing table;
a trigger sensor comprising a first member disposed at the polishing table and a second member disposed outside the polishing table, the trigger sensor being configured to output a trigger signal indicating that the polishing table makes one revolution based on positional relationship between the first member and the second member; and
a film thickness measuring sensor disposed at the polishing table, the film thickness measuring sensor configured to measure the film thickness of the subject to be polished when the predetermined time has elapsed since the trigger sensor outputs the trigger signal.

20. The polishing device according to claim 19, wherein a rotation axis of the polishing table is disposed between the second member and the holding unit.

21. The polishing device according to claim 20, wherein when the trigger signal is output from the trigger sensor:
the rotation axis is located between the film thickness measuring sensor and the holding unit,
the rotation axis is located between the first member and the holding unit, and
the film thickness measuring sensor is not located under the holding unit.

22. The polishing device according to claim 19, wherein the film thickness measuring sensor starts measuring before the subject to be polished becomes located above the film thickness measuring sensor.

* * * * *